United States Patent
Hong

(10) Patent No.: US 10,402,202 B2
(45) Date of Patent: Sep. 3, 2019

(54) PIPE LATCH CIRCUIT WHICH CONTROLS OUTPUT OF DATA IN A READ OPERATION AND DATA OUTPUT CIRCUIT INCLUDING THE SAME

(71) Applicant: SK hynix Inc., Gyeonggi-do (KR)

(72) Inventor: Yun-Gi Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/713,781

(22) Filed: Sep. 25, 2017

(65) Prior Publication Data

US 2018/0165098 A1 Jun. 14, 2018

(30) Foreign Application Priority Data

Dec. 13, 2016 (KR) .................. 10-2016-0169505

(51) Int. Cl.
*G11C 7/10* (2006.01)
*G06F 9/38* (2018.01)
*G11C 7/22* (2006.01)

(52) U.S. Cl.
CPC ............ *G06F 9/3869* (2013.01); *G11C 7/103* (2013.01); *G11C 7/106* (2013.01); *G11C 7/1039* (2013.01); *G11C 7/222* (2013.01)

(58) Field of Classification Search
CPC ..... G06F 9/3869; G11C 7/103; G11C 7/1039; G11C 7/106; G11C 7/222
See application file for complete search history.

(56) References Cited

U.S. PATENT DOCUMENTS

| | | | | |
|---|---|---|---|---|
| 6,215,837 B1* | 4/2001 | Yi | .................. | G11C 7/1039 365/236 |
| 7,411,842 B2* | 8/2008 | Shin | ................... | G11C 7/1039 365/191 |
| 9,660,617 B2* | 5/2017 | Kong | .................. | H03K 3/0375 |
| 2007/0070676 A1* | 3/2007 | Kim | .................... | G11C 7/1039 365/78 |
| 2007/0070677 A1* | 3/2007 | Shin | .................... | G11C 7/1039 365/78 |
| 2007/0070715 A1* | 3/2007 | Kim | .................... | G11C 7/1039 365/189.05 |
| 2011/0211397 A1* | 9/2011 | Lee | ..................... | G11C 7/1039 365/189.05 |
| 2012/0008422 A1* | 1/2012 | Kim | .................... | G11C 7/04 365/189.05 |
| 2015/0098283 A1* | 4/2015 | Ku | ..................... | G11C 7/1039 365/193 |

FOREIGN PATENT DOCUMENTS

| KR | 100546385 | 1/2006 |
|---|---|---|
| KR | 1020150138933 | 12/2015 |

* cited by examiner

*Primary Examiner* — Mushfique Siddique
(74) *Attorney, Agent, or Firm* — IP & T Group LLP

(57) ABSTRACT

A pipe latch circuit includes: a pipe latch control block suitable for controlling a plurality of pipe input signals and a plurality of pipe output signals to be activated sequentially or be divided into at least two groups and be activated sequentially by group, depending on a latency setting value, and outputting at least one pipe input signal and at least one pipe output signal; and a pipe latch block coupled between an input node and an output node, and suitable for storing data of the input node in response to the pipe input signal and outputting stored data to the output node in response to the pipe output signal.

14 Claims, 10 Drawing Sheets

PIPE LATCH CIRCUIT WHICH CONTROLS OUTPUT OF DATA IN A READ OPERATION AND DATA OUTPUT CIRCUIT INCLUDING THE SAME

CROSS-REFERENCE TO RELATED APPLICATION

This application claims priority under 35 U.S.C. § 119 to Korean Patent Application No. 10-2016-0169505 filed on Dec. 13, 2016 in the Korean Intellectual Property Office, the disclosure of which is incorporated herein by reference in its entirety.

TECHNICAL FIELD

Exemplary embodiments relate to a semiconductor design technology, and more particularly, to a pipe latch circuit which controls output of data in a read operation and a data output circuit including the same.

DISCUSSION OF THE RELATED ART

Recently, semiconductor memory devices continuously trend toward high degree of integration and high speed operation according to the development of technologies, and are used by being mounted in various products ranging from large home appliances to small-sized mobile products. Each of such semiconductor memory devices is constructed by a plurality of cells which store data.

In general, a synchronous memory may include a pipe latch circuit to output data successively. The pipe latch circuit is a circuit which plays the role of receiving and storing data from a cell region and sequentially outputting the data to an output driver in synchronization with a clock signal. The number of registers constructing the pipe latch circuit varies depending on the number of data to be received and latched. The number of registers constructing the pipe latch circuit is determined by a column access strobe (CAS) latency of a memory device. Pipe latch circuits are classified, depending on a method of control, into a serial pipe latch circuit in which registers are coupled in series and a parallel pipe latch circuit in which registers are coupled in parallel.

In the case of using the parallel pipe latch circuit, the larger a CAS latency setting value is, the larger the number of pipe latches to be used becomes. In this case, while it is possible to stably output data because a standby time for outputting the data is long, the area occupied by the pipe latch circuits increases, and the long standby time for outputting the data makes it difficult to be suited for a high speed operation. Conversely, if a CAS latency setting value is small, output data may be delayed due to a plurality of stages of pipes stacked in parallel.

SUMMARY

Various embodiments are directed to a pipe latch circuit capable of controlling the grouping of parallel pipe latches depending on a column access strobe (CAS) latency setting value, and a data output circuit including the same.

In an embodiment, a pipe latch circuit may include: a pipe latch control block suitable for controlling a plurality of pipe input signals and a plurality of pipe output signals to be activated sequentially or be divided into at least two groups and be activated sequentially by group, depending on a latency setting value, and outputting at least one pipe input signal and at least one pipe output signal; and a pipe latch block coupled between an input node and an output node, and suitable for storing data of the input node in response to the pipe input signal and outputting stored data to the output node in response to the pipe output signal.

The pipe latch control block may include: a first pipe latch control block suitable for controlling the pipe input signals to be activated sequentially or be divided into at least two groups and be sequentially activated by each group, in response to a pipe input clock signal; and a second pipe latch control block suitable for controlling the pipe output signals to be activated sequentially or be divided into the at least two groups and be sequentially activated by the each group, in response to a pipe output clock signal.

The first pipe latch control block may include: a plurality of shift registers suitable for outputting sequentially a plurality of shifting signals, respectively, in response to the pipe input clock signal; a switching unit suitable for controlling all of the plurality of shift registers to operate, in response to a first latency setting signal of the latency setting value, and controlling only one or more among the plurality of shift registers to operate, in response to a second latency setting signal of the latency setting value; a plurality of AND gates suitable for performing AND operations on the pipe input clock signal and the plurality of shifting signals, and outputting shifting data signals; and a pipe input control unit suitable for outputting the shifting data signals as the plurality of pipe input signals in response to the first or second latency setting signal.

The first latency setting signal may be activated in the case where the latency setting value corresponding to a column address strobe (CAS) latency is relatively long, and the second latency setting signal may be activated in the case where the latency setting value is relatively short.

The second pipe latch control block may include: a plurality of shift registers suitable for outputting sequentially a plurality of shifting signals, respectively, in response to the pipe output clock signal; a switching unit suitable for controlling all of the plurality of shift registers to operate, in response to a first latency setting signal of the latency setting value, and controlling only one or more among the plurality of shift registers to operate, in response to a second latency setting signal of the latency setting value; a plurality of AND gates suitable for performing AND operations on the pipe output clock signal and the plurality of shifting signals, and outputting shifting data signals; and a pipe output control unit suitable for outputting the shifting data signals as the plurality of pipe output signals in response to the first or second latency setting signal.

Pipe input signals included in the same group of the at least two group among the plurality of pipe input signals and pipe output signals included in the same group of the at least two group among the plurality of pipe output signals may be activated simultaneously.

The pipe latch block sequentially may receive the plurality of pipe input signals and the plurality of pipe output signals, in response to the first latency setting signal, and store and output data individually.

The pipe latch block sequentially may receive the plurality of pipe input signals and the plurality of pipe output signals by the each group, in response to the second latency setting signal, and store and output data by the each group.

In an embodiment, a data output circuit may include: a delay-locked loop suitable for delaying an external clock signal by a delay value depending on a latency information, and outputting an output clock signal; a pipe latch block coupled between an input node and an output node, and suitable for storing data of the input node in response to at least one corresponding pipe input signal among a plurality of pipe input signals and outputting stored data to the output node in response to at least one corresponding pipe output signal among a plurality of pipe output signals; a first pipe latch control block suitable for controlling the plurality of pipe input signals to be activated sequentially or be divided into at least two groups depending on the latency information and be sequentially activated by each group, in response to a pipe input clock signal; and a second pipe latch control block suitable for controlling the plurality of pipe output signals to be activated sequentially or be divided into the at least two groups depending on the latency information and be sequentially activated by the each group, in response to a pipe output clock signal generated in response to the output clock signal.

The number of the at least two groups and the delay value may be larger in the case where the latency information corresponds to a long latency than the case where the latency information corresponds to a short latency.

The long latency may be activated in the case where a column address strobe (CAS) latency is relatively long, and the short latency may be activated in the case where the CAS latency is relatively short.

The first pipe latch control block may include: a plurality of shift registers suitable for outputting sequentially a plurality of shifting signals, respectively, in response to the pipe input clock signal; a switching unit suitable for controlling all of the plurality of shift registers to operate, in response to a first latency setting signal in the case where the latency information corresponds to the long latency, and controlling only one or more among the plurality of shift registers to operate, in response to a second latency setting signal in the case where the latency information corresponds to the short latency; a plurality of AND gates suitable for performing AND operations on the pipe input clock signal and the plurality of shifting signals, and outputting shifting data signals; and a pipe input control unit suitable for outputting the shifting data signals as the plurality of pipe input signals in response to the first or second latency setting signal.

The second pipe latch control block may include: a plurality of shift registers suitable for outputting sequentially a plurality of shifting signals, respectively, in response to the pipe output clock signal; a switching unit suitable for controlling all of the plurality of shift registers to operate, in response to a first latency setting signal in the case where the latency information corresponds to the long latency, and controlling only one or more among the plurality of shift registers to operate, in response to a second latency setting signal in the case where the latency information corresponds to the short latency; a plurality of AND gates suitable for performing AND operations on the pipe output clock signal and the plurality of shifting signals, and outputting shifting data signals; and a pipe output control unit suitable for outputting the shifting data signals as the plurality of pipe output signals in response to the first or second latency setting signal.

Pipe input signals included in the same group of the at least two group among the plurality of pipe input signals and pipe output signals included in the same group of the at least two group among the plurality of pipe output signals may be activated simultaneously.

The delay-locked loop may include: a phase comparison unit suitable for comparing the external clock signal and a feedback clock signal, and outputting a comparison result value as a phase comparison signal; a delay line control unit suitable for generating a delay control signal in response to the phase comparison signal; a delay line unit suitable for determining a delay time in response to the delay control signal, delaying the external clock signal by the delay value, and generating a delay-locked loop (DLL) clock signal; and a replica delay unit suitable for controlling an internal delay value in response to the latency information, delaying the DLL clock signal according to the internal delay value, and generating the feedback clock signal.

The data output circuit may further include: a pipe output clock generation block suitable for generating the pipe output clock signal in response to the DLL clock signal.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
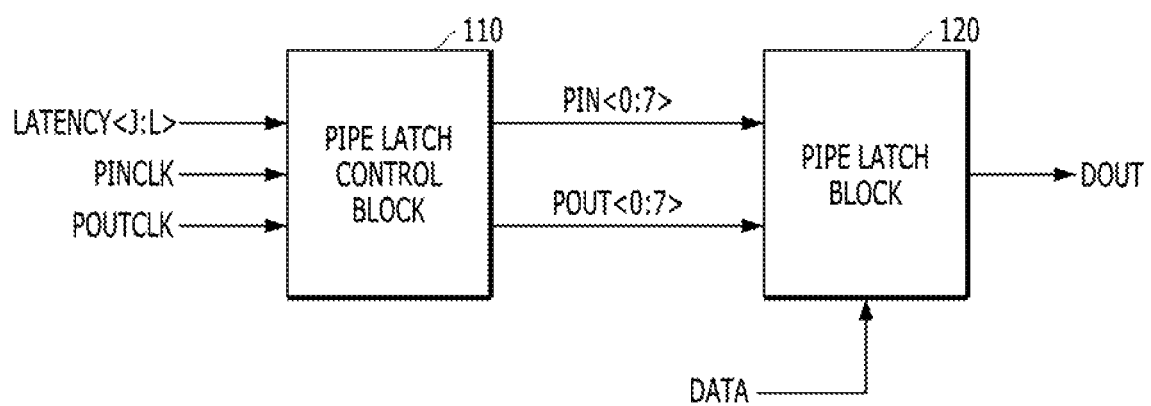
FIG. 1 is a diagram illustrating a pipe latch circuit in accordance with an embodiment of the present invention.

FIG. 1 is a diagram illustrating a pipe latch circuit in accordance with an embodiment of the present invention;

Referring to FIG. 1, the pipe latch circuit may include a pipe latch control block 110 and a pipe latch block 120.

The pipe latch control block 110 may control a plurality of pipe input signals PIN<0:7> to be activated sequentially or to be divided into at least two groups and be activated sequentially by group, in response to a plurality of latency setting signals LATENCY<J:L> which are inputted according to first to third modes, respectively, and a pipe input clock signal PINCLK. Also, the pipe latch control block 110 may control a plurality of pipe output signals POUT<0:7> to be activated sequentially or to be divided into at least two groups and be activated sequentially by group, in response to the plurality of latency setting signals LATENCY<J:L> and a pipe output clock signal POUTCLK.

First, the first mode may represent an operation mode in the case where an output latency of data is relatively long. In the first mode, a first latency setting signal LATENCY<J> may be activated among the plurality of latency setting signals LATENCY<J:L>. In the first mode, the pipe latch control block 110 may sequentially activate and output the plurality of pipe input signals PIN<0:7> and the plurality of pipe output signals POUT<0:7> in response to the first latency setting signal LATENCY<J>.

The second mode may represent an operation mode in the case where an output latency of data is shorter than the first mode. In the second mode, a second latency setting signal LATENCY<L> may be activated among the plurality of latency setting signals LATENCY<J:L>. In the second mode, in response to the second latency setting signal LATENCY<L>, the pipe latch control block 110 may divide the plurality of pipe input signals PIN<0:7> into two groups and sequentially activate and output the plurality of pipe input signals PIN<0:7> by group. Also, the pipe latch control block 110 may divide the plurality of pipe output signals POUT<0:7> into two groups and sequentially activate and output the plurality of pipe output signals POUT<0:7> by group. For example, the plurality of pipe input signals PIN<0:7> may be divided into the group of first to fourth pipe input signals PIN<0:3> and the group of fifth to eighth pipe input signals PIN<4:7>. Similarly, the plurality of pipe output signals POUT<0:7> may be divided into the group of first to fourth pipe output signals POUT<0:3> and the group of fifth to eighth pipe output signals POUT<4:7>.

Lastly, the third mode may represent an operation mode in the case where an output latency of data is shorter than the first node and longer than the second mode. In the third mode, a third latency setting signal LATENCY<K> may be activated among the plurality of latency setting signals LATENCY<J:L>. In the third mode, in response to the third latency setting signal LATENCY<K>, the pipe latch control block 110 may divide the plurality of pipe input signals PIN<0:7> into four groups and sequentially activate and output the plurality of pipe input signals PIN<0:7> by group. Also, the pipe latch control block 110 may divide the plurality of pipe output signals POUT<0:7> into four groups and sequentially activate and output the plurality of pipe output signals POUT<0:7> by group. For example, the plurality of pipe input signals PIN<0:7>, i.e., PIN<0:1>, PIN<2:3>, PIN<4:5> and PIN<6:7>. Similarly, the plurality of pipe output signals POUT<0:7> may be divided into four groups of pipe output signals POUT<0:1>, POUT<2:3>, POUT<4:5> and POUT<6:7>.

The pipe latch block 120 may be coupled between an input node DIN (see FIG. 3) and an output node DOUT. The pipe latch block 120 may store data DATA of the input node DIN in response to the plurality of pipe input signals PIN<0:7> received sequentially from the pipe latch control block 110, and output stored data to the output node DOUT in response to the plurality of pipe output signals POUT<0:7> received sequentially from the pipe latch control block 110. The pipe latch block 120 may include a plurality of pipe registers (not shown in FIG. 1). As the plurality of pipe input signals PIN<0:7> and the plurality of pipe output signals POUT<0:7> from the pipe latch control block 110 are individually received sequentially or are grouped and are received sequentially in groups, the plurality of pipe registers may perform data storage and output operations individually or by group.

Figure 2A:
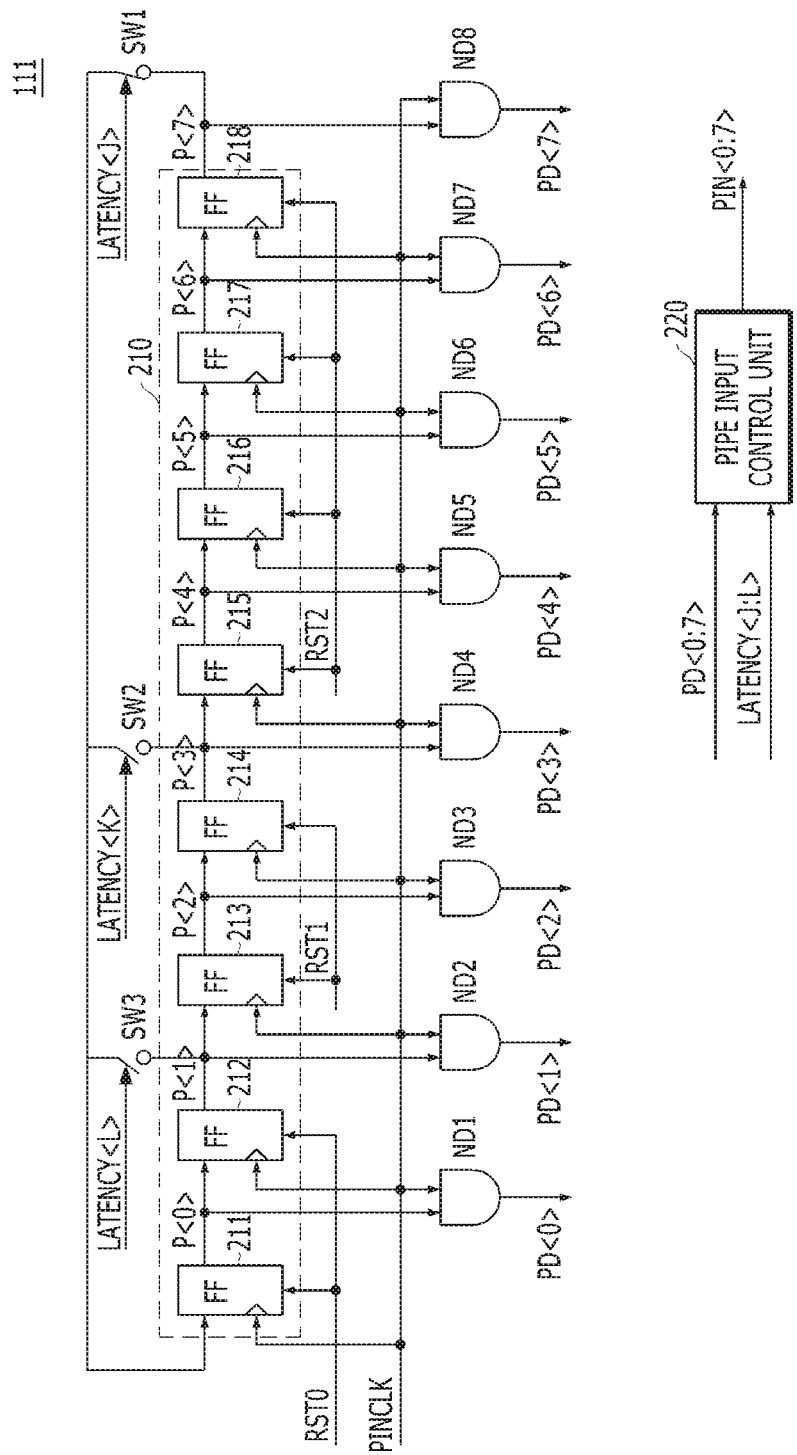
FIGS. 2A and 2B are circuit diagrams illustrating a pipe latch control block in accordance with an embodiment of the present invention.
Figure 2B:
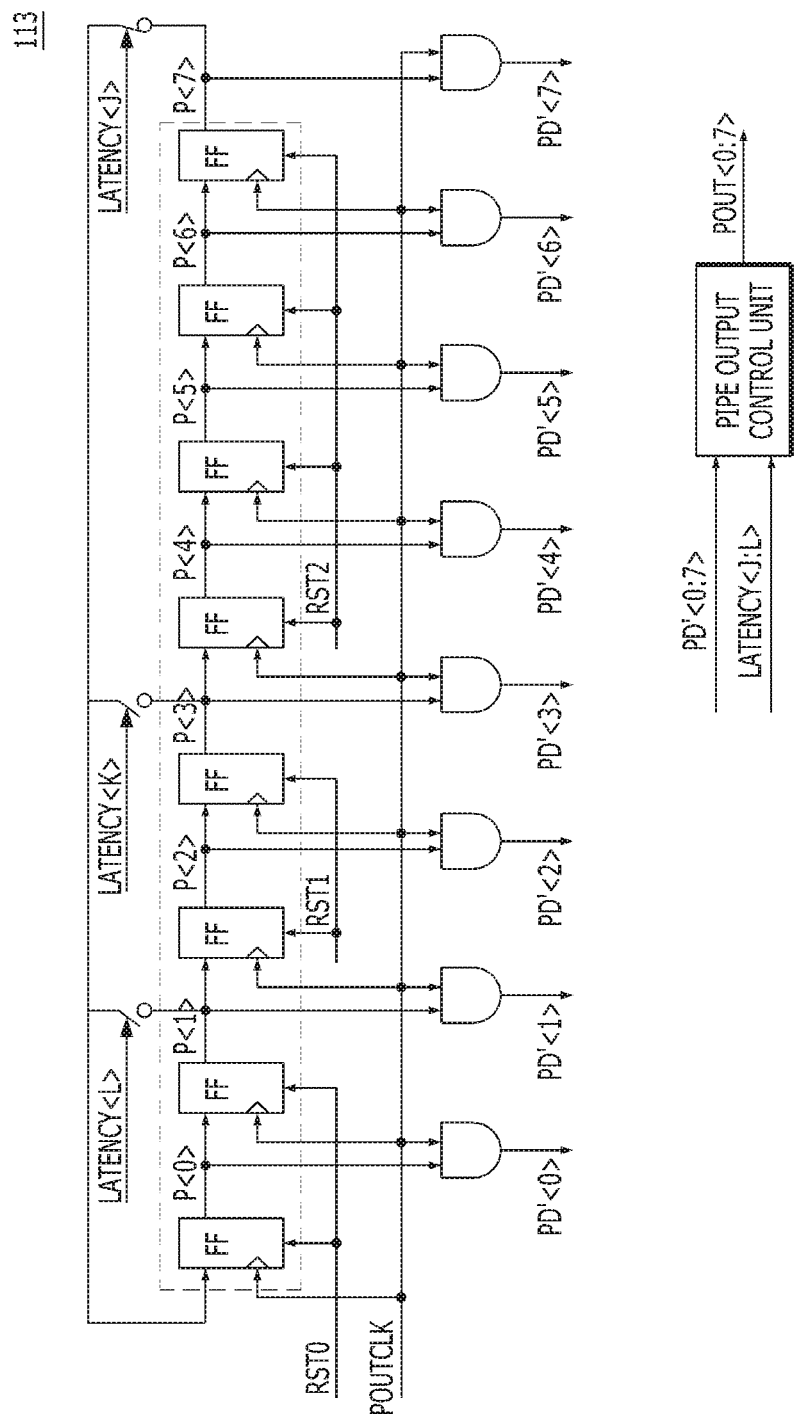

FIGS. 2A and 2B are circuit diagrams illustrating a pipe latch control block in accordance with an embodiment, for example, the pipe latch control block 110 shown in FIG. 1.

Referring to FIGS. 2A and 2B, the pipe latch control block 110 may be configured to include a first pipe latch control block 111 (see FIG. 2A) and a second pipe latch control block 113 (see FIG. 2B). Since the first and second pipe latch control blocks 111 and 113 have the same configuration and perform the same operation, the first pipe latch control block 111 will be described below representatively. That is to say, FIG. 2A may illustrate the first pipe latch control block 111 as a component of the pipe latch control block 110.

The first pipe latch control block 111 may include a shift register unit 210, a pipe input control unit 220, and a plurality of NAND gates ND1 to ND8 which operate in response to a plurality of shifting signals P<0:7> and the pipe input clock signal PINCLK.

The second pipe latch control block 113 may have the same configuration as the first pipe latch control block 111. Compared to the first pipe latch control block 111, the second pipe latch control block 113 may have a difference in that it operates by receiving the pipe output clock signal POUTCLK instead of the pipe input clock signal PINCLK and includes a pipe output control unit which outputs finally the plurality of pipe output signals POUT<0:7>, instead of the pipe input control unit 220.

The shift register unit 210 may be reset in response to one signal among first to third initialization (or reset) signals RST0, RST1 and RST2, and output the plurality of shifting signals P<0:7> in response to the pipe input clock signal PINCLK. The shift register unit 210 may include a plurality of shift registers 211 to 218, each of which may be implemented with a flip-flop. Each shift register may receive the corresponding initialization signal among the initialization signals RST0 to RST2 and the corresponding shifting signal among the plurality of shifting signals P<0:7> from the shift register in the previous stage, and output the corresponding shifting signal to the shift register in the next stage.

First and second shift registers 211 and 212 may respectively output first and second shifting signals P<0> and P<1> among the plurality of shifting signals P<0:7> and may be reset in response to the first initialization signal RST0. Third and fourth shift registers 213 and 214 may respectively output third and fourth shifting signals P<2> and P<3> and may be reset in response to the second initialization signal RST1. Fifth to eighth shift registers 215, 216, 217 and 218 may respectively output fifth to eighth shifting signals P<4>, P<5>, P<6> and P<7> and may be reset in response to the third initialization signal RST2.

The plurality of NAND gates ND1 to ND8 may respectively perform NAND logic functions on the plurality of shifting signals P<0:7> and the pipe input clock signal PINCLK, and output shifting data signals PD<0:7>.

The first pipe latch control block 111 may further include first to third switches SW1 to SW3. The first switch SW1 may be coupled between the input node of the first shift register 211 and the output node of the eighth shift register 218, and be switched on in response to the first latency setting signal LATENCY<J>. The second switch SW2 may be coupled between the input node of the first shift register 211 and the output node of the fourth shift register 214, and be switched on in response to the third latency setting signal LATENCY<K>. The third switch SW3 may be coupled between the input node of the first shift register 211 and the output node of the second shift register 212, and be switched on in response to the second latency setting signal LATENCY<L>.

The pipe input control unit 220 may generate the plurality of pipe input signals PIN<0:7> in response to the plurality of shifting data signals PD<0:7> and the latency setting signals LATENCY<J:L>. The pipe input control unit 220 may be configured by a multiplexer circuit which outputs selectively the plurality of shifting data signals PD<0:7> depending on the latency setting signals LATENCY<J:L>.

Hereafter, operations of the pipe latch circuit according to the first to third modes will be described with reference to FIGS. 3 to 8.

Figure 3:
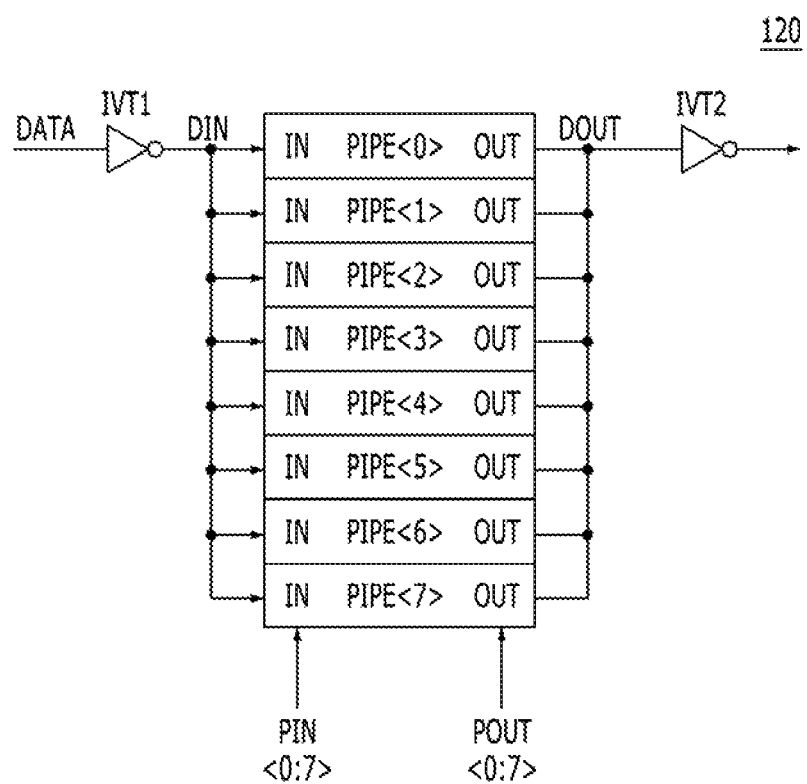
FIG. 3 is a diagram illustrating a pipe latch block corresponding to a first mode in accordance with an embodiment of the present invention.

FIG. 3 is a diagram illustrating a pipe latch block corresponding to a first mode in accordance with an embodiment, for example, the pipe latch block 120 corresponding to the first mode shown in FIG. 1.

Referring to FIG. 3, the pipe latch block 120 may be configured by first to eighth pipe registers PIPE<0:7 receiving the plurality of pipe input signals PIN<0:7> and the plurality of pipe output signals POUT<0:7>, respectively.

The respective first to eighth pipe registers PIPE<0:7> may be coupled between the input node DIN and the output node DOUT. The respective first to eighth pipe registers PIPE<0:7> may sequentially store therein data DATA of the input node DIN in response to the plurality of pipe input signals PIN<0:7> received sequentially through the pipe latch control block 110. The respective first to eighth pipe registers PIPE<0:7> may output data stored therein, sequentially to the output node DOUT, in response to the plurality of pipe output signals POUT<0:7> received sequentially through the pipe latch control block 110.

Meanwhile, data DATA may be transferred to the input node DIN by being inverted through a first inverter IVT1, and data of the output node DOUT may be finally outputted by being inverted through a second inverter IVT2.

The operation of the pipe latch circuit according to the first mode will be described below with reference to FIG. 4.

Figure 4:
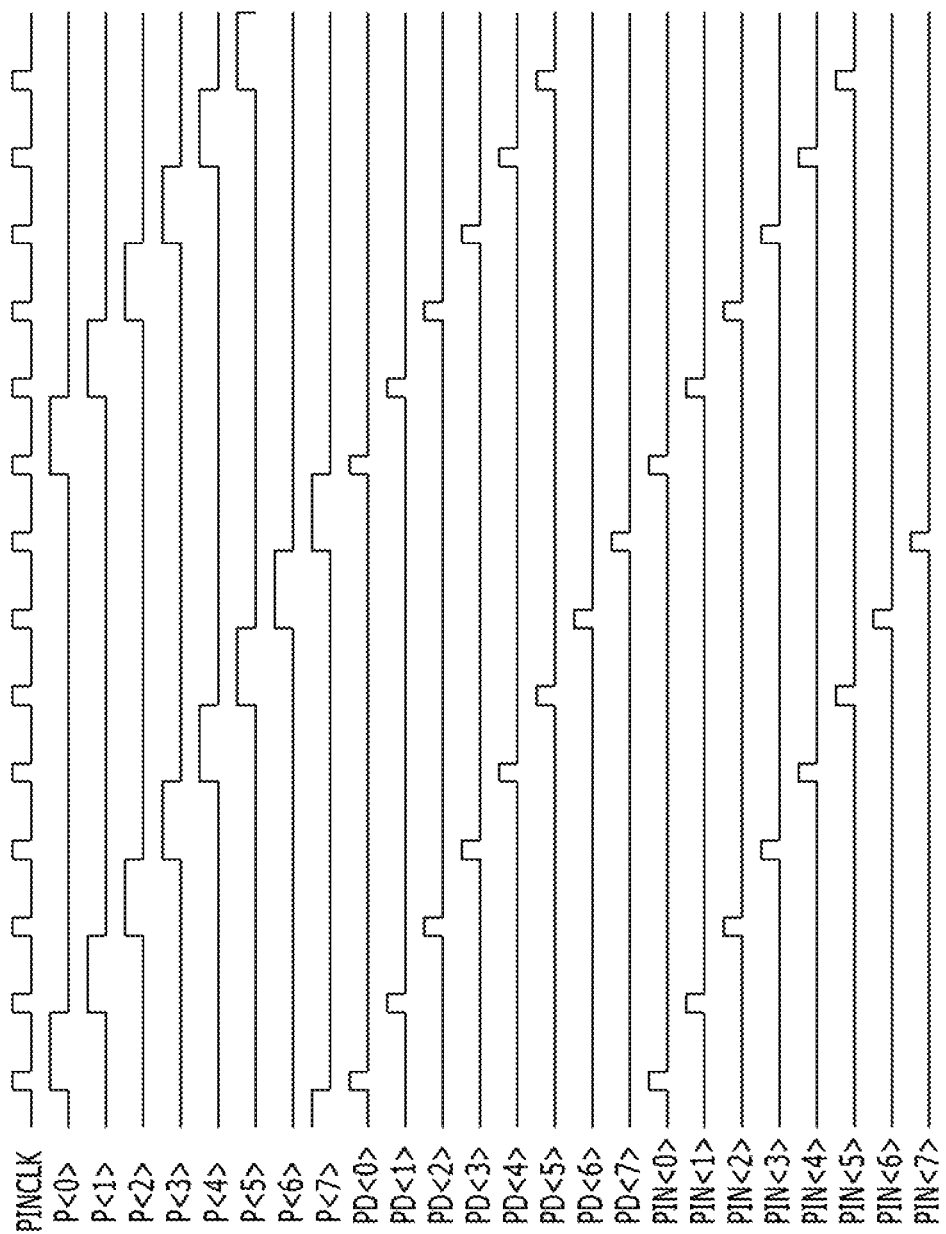
FIG. 4 is a timing diagram illustrating an operation of a pipe latch circuit according to a first mode in accordance with an embodiment of the present invention.

FIG. 4 is a timing diagram illustrating the operation of the pipe latch circuit according to the first mode in FIG. 1.

Referring to FIG. 4, in the pipe latch control block 110 of FIGS. 2A and 2B, in the first mode, the first switch SW1 may be switched on as the first latency setting signal LATENCY<J> is activated. According to this fact, the first to eighth shift registers 211 to 218 may output the plurality of shifting signals P<0:7>, respectively, which are activated sequentially in response to the pipe input clock signal PINCLK which toggles. The plurality of shifting signals P<0:7> outputted may be NAND operated with the pipe input clock signal PINCLK through the plurality of NAND gates ND1 to ND8 and be outputted as the plurality of shifting data signals PD<0:7> which are activated sequentially. The pipe input control unit 220 may output the plurality of shifting data signals PD<0:7> which are activated sequentially, as the plurality of pipe input signals PIN<0:7>, in response to the first latency setting signal LATENCY<J>.

Therefore, the pipe input signals PIN<0:7> may be inputted to the pipe latch block 120 of FIG. 3 by being activated sequentially. While not shown in the drawing, similarly to the pipe input signals PIN<0:7>, the pipe output signals POUT<0:7> may also be inputted to the pipe latch block 120 by being activated sequentially.

The pipe latch block 120 may sequentially store data DATA of the input node DIN in the first to eighth pipe registers PIPE<0:7> in response to the plurality of pipe input signals PIN<0:7> received sequentially through the pipe latch control block 110. Then, the pipe latch block 120 may output the data respectively stored in the first to eighth pipe registers PIPE<0:7>, sequentially to the output node DOUT, in response to the plurality of pipe output signals POUT<0:7> received sequentially through the pipe latch control block 110.

Figure 5:
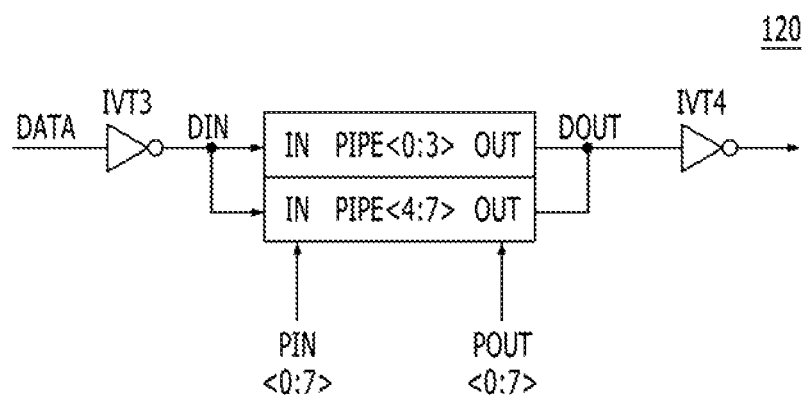
FIG. 5 is a diagram illustrating a pipe latch block corresponding to a second mode in accordance with an embodiment of the present invention.

FIG. 5 is a diagram illustrating a pipe latch block corresponding to a second mode in accordance with an embodiment, for example, the pipe latch block 120 of FIG. 1 in the second mode.

Referring to FIG. 5, the pipe latch block 120 may be configured by the first to fourth pipe registers PIPE<0:3> which are grouped and the fifth to eighth pipe registers PIPE<4:7> which are grouped. The first to eighth pipe registers PIPE<0:7> may receive the plurality of pipe input signals PIN<0:7> and the plurality of pipe output signals POUT<0:7>. For the sake of convenience in explanation, the first to fourth pipe registers PIPE<0:3> will be referred to as a first pipe register group PIPE<0:3>, and the fifth to eighth pipe registers PIPE<4:7> will be referred to as a second pipe register group PIPE<4:7>.

The first and second pipe register groups PIPE<0:3> and PIPE<4:7> may be coupled between the input node DIN and the output node DOUT. The first and second pipe register groups PIPE<0:3> and PIPE<4:7> may store therein data DATA of the input node DIN in response to the plurality of pipe input signals PIN<0:7> received sequentially by group through the pipe latch control block 110 by being divided into two groups. The first and second pipe register groups PIPE<0:3> and PIPE<4:7> may output data stored therein, to the output node DOUT, in response to the plurality of pipe output signals POUT<0:7> received sequentially by group through the pipe latch control block 110 by being divided into two groups.

The plurality of pipe input signals PIN<0:7> may be received sequentially by group by being divided into a first pipe input signal group PIN<0:3> and a second pipe input signal group PIN<4:7>. Similarly, the plurality of pipe output signals POUT<0:7> may be received sequentially by group by being divided into a first pipe output signal group POUT<0:3> and a second pipe output signal group POUT<4:7>.

Meanwhile, data DATA may be transferred to the input node DIN by being inverted through a third inverter IVT3, and data of the output node DOUT may be finally outputted by being inverted through a fourth inverter IVT4.

The operation of the pipe latch circuit according to the second mode will be described below with reference to FIG. 6.

Figure 6:
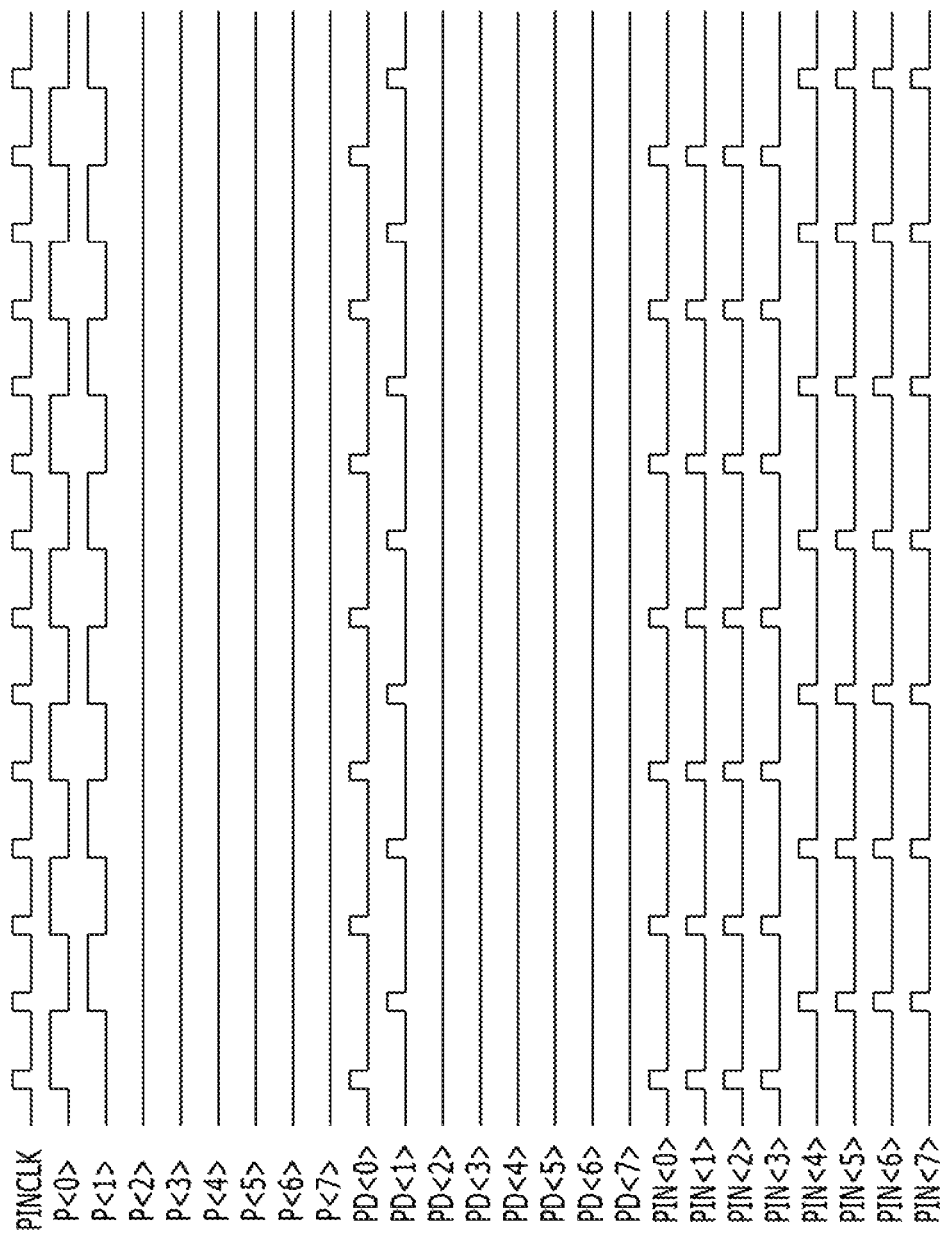
FIG. 6 is a timing diagram illustrating an operation of a pipe latch circuit according to a second mode in accordance with an embodiment of the present invention.

FIG. 6 is a timing diagram illustrating the operation of the pipe latch circuit according to the second mode in FIG. 1.

Referring to FIG. 6, in the pipe latch control block 110 of FIGS. 2A and 2B, in the second mode, the third switch SW3 may be switched on as the second latency setting signal LATENCY<L> is activated. The third to eighth shift registers 213 to 218 may be reset in response to the second and third initialization signals RST1 and RST2. According to this fact, the first and second shift registers 211 and 212 may output the first and second shifting signals P<0:1> which are sequentially activated, respectively, in response to the pipe input clock signal PINCLK which toggles. The first and second shifting signals P<0:1> outputted may be NAND operated with the pipe input clock signal PINCLK through the first and second NAND gates ND1 and ND2, respectively, and be outputted as first and second shifting data signals PD<0:1> which are activated sequentially. The pipe input control unit 220 may operate in response to the second latency setting signal LATENCY<L>, output the first to fourth pipe input signals PIN<0:3> which are activated simultaneously, in response to the first shifting data signal PD<0>, and output the fifth to eighth pipe input signals PIN<4:7> which are activated simultaneously, in response to the second shifting data signal PD<1>.

Therefore, the first and second pipe input signal groups PIN<0:3> and PIN<4:7> may be inputted to the pipe latch block 120 of FIG. 5 by being activated sequentially by group. While not shown in the drawing, the pipe output signals POUT<0:7> may also be divided into first and second pipe output signal groups POUT<0:3> and POUT<4:7>, and be inputted to the pipe latch block 120 by being activated sequentially by group.

The pipe latch block 120 may sequentially store data DATA of the input node DIN in the first and second pipe register groups PIPE<0:3> and PIPE<4:7> in response to the first and second pipe input signal groups PIN<0:3> and PIN<4:7> received sequentially by group through the pipe latch control block 110. The pipe latch block 120 may output the data respectively stored in the first and second pipe register groups PIPE<0:3> and PIPE<4:7>, sequentially to the output node DOUT, in response to the first and second pipe output signal groups POUT<0:3> and POUT<4:7> received sequentially by group through the pipe latch control block 110.

Figure 7:
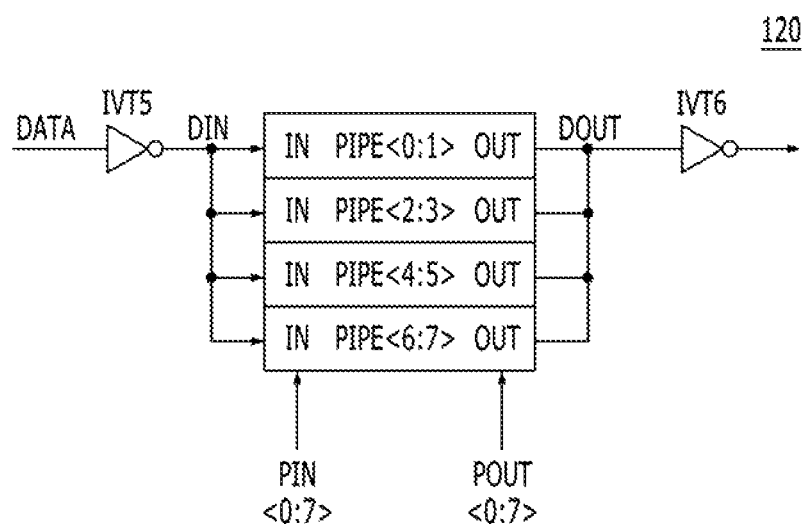
FIG. 7 is a diagram illustrating a pipe latch block corresponding to a third mode in accordance with an embodiment of the present invention.

FIG. 7 is a diagram illustrating a pipe latch block corresponding to a third mode in accordance with an embodiment, for example, the pipe latch block 120 of FIG. 1 in the third mode.

Referring to FIG. 7, the pipe latch block 120 may be configured by the first and second pipe registers PIPE<0:1>, the third and fourth pipe registers PIPE<2:3>, the fifth and sixth pipe registers PIPE<4:5>, and the seventh and eighth pipe registers PIPE<6:7>. For the sake of convenience in explanation, the first and second pipe registers PIPE<0:1> will be referred to as a first pipe register group PIPE<0:1>, the third and fourth pipe registers PIPE<2:3> will be referred to as a second pipe register group PIPE<2:3>, the fifth and sixth pipe registers PIPE<4:5> will be referred to as a third pipe register group PIPE<4:5>, and the seventh and eighth pipe registers PIPE<6:7> will be referred to as a fourth pipe register group PIPE<6:7>.

The first to fourth pipe register groups PIPE<0:1>, PIPE<2:3>, PIPE<4:5> and PIPE<6:7> may receive the plurality of pipe input signals PIN<0:7> and the plurality of pipe output signals POUT<0:7>.

The respective first to fourth pipe register groups PIPE<0:1>, PIPE<2:3>, PIPE<4:5> and PIPE<6:7> may be coupled between the input node DIN and the output node DOUT. The respective first to fourth pipe register groups PIPE<0:1>, PIPE<2:3>, PIPE<4:5> and PIPE<6:7> may store therein data DATA of the input node DIN in response to the plurality of pipe input signals PIN<0:7> received sequentially by group through the pipe latch control block 110 by being divided into four groups. The respective first to fourth pipe register groups PIPE<0:1>, PIPE<2:3>, PIPE<4:5> and PIPE<6:7> may output data stored therein, to the output node DOUT, in response to the plurality of pipe output signals POUT<0:7> received sequentially by group through the pipe latch control block 110 by being divided into four groups.

The plurality of pipe input signals PIN<0:7> may be received sequentially by group by being divided into first to fourth pipe input signal groups PIN<0:1>, PIN<2:3>, PIN<4:5> and PIN<6:7>. Similarly, the plurality of pipe output signals POUT<0:7> may be received sequentially by group by being divided into first to fourth pipe output signal groups POUT<0:1>, POUT<2:3>, POUT<4:5> and POUT<6:7>.

Meanwhile, data DATA may be transferred to the input node DIN by being inverted through a fifth inverter IVT5, and data of the output node DOUT may be finally outputted by being inverted through a sixth inverter IVT6.

The operation of the pipe latch circuit according to the third mode will be described below with reference to FIG. 8.

Figure 8:
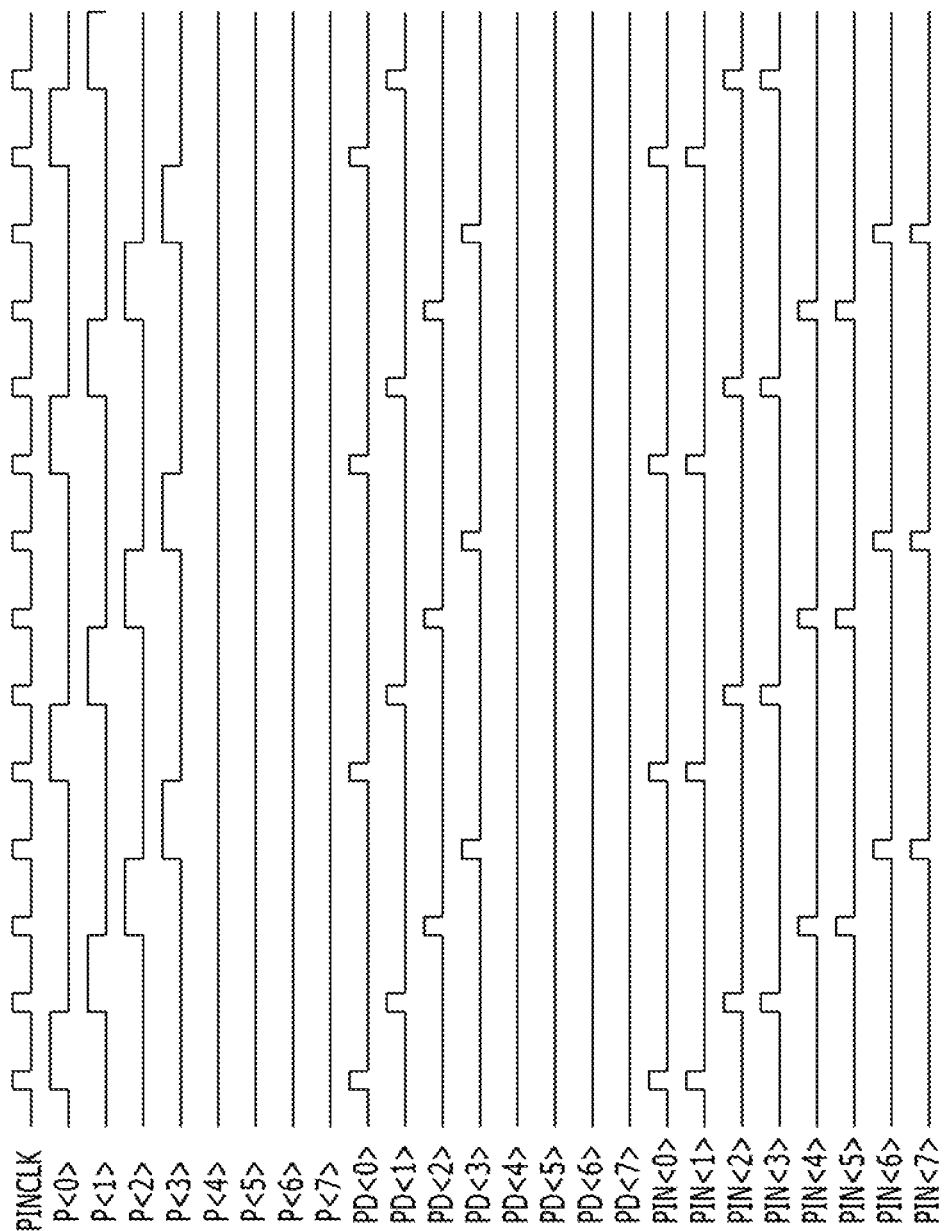
FIG. 8 is a timing diagram illustrating an operation of a pipe latch circuit according to the third mode in accordance with an embodiment of the present invention.

FIG. 8 is a timing diagram illustrating the operation of the pipe latch circuit of FIG. 1 according to the third mode.

Referring to FIG. 8, in the pipe latch control block 110 of FIGS. 2A and 2B, in the third mode, the second switch SW2 may be switched on as the third latency setting signal LATENCY<K> is activated. According to this fact, the fifth to eighth shift registers 215 to 218 may be reset in response to the third initialization signal RST2, and the first to fourth shift registers 211 to 214 may output the first to fourth shifting signals P<0:3>, respectively, which are sequentially activated, in response to the pipe input clock signal PINCLK which toggles. The first to fourth shifting signals P<0:3> outputted may be NAND operated with the pipe input clock signal PINCLK through the first to fourth NAND gates ND1 to ND4, respectively, and be outputted as first to fourth shifting data signals PD<0:3> which are activated sequentially. The pipe input control unit 220 may operate in response to the third latency setting signal LATENCY<K>, output the first and second pipe input signals PIN<0:1> in response to the first shifting data signal PD<0>, output the third and fourth pipe input signals PIN<2:3> in response to the second shifting data signal PD<1>, output the fifth and sixth pipe input signals PIN<4:5> in response to the third shifting data signal PD<2>, and output the seventh and eighth pipe input signals PIN<6:7> in response to the fourth shifting data signal PD<3>.

Therefore, the first to fourth pipe input signal groups PIN<0:1>, PIN<2:3>, PIN<4:5> and PIN<6:7> may be inputted to the pipe latch block 120 of FIG. 7 by being activated sequentially by group. While not shown in the drawing, the pipe output signals POUT<0:7> may also be divided into first to fourth pipe output signal groups POUT<0:1>, POUT<2:3>, POUT<4:5> and POUT<6:7>, and be inputted to the pipe latch block 120 by being activated sequentially by group.

The pipe latch block 120 may sequentially store data DATA of the input node DIN in the first to fourth pipe register groups PIPE<0:1>, PIPE<2:3>, PIPE<4:5> and PIPE<6:7> in response to the first to fourth pipe input signal groups PIN<0:1>, PIN<2:3>, PIN<4:5> and PIN<6:7> received sequentially by group through the pipe latch control block 110. The pipe latch block 120 may output the data respectively stored in the first to fourth pipe register groups PIPE<0:1>, PIPE<2:3>, PIPE<4:5> and PIPE<6:7>, sequentially to the output node DOUT, in response to the first to fourth pipe output signal groups POUT<0:1>, POUT<2:3>, POUT<4:5> and POUT<6:7> received sequentially by group through the pipe latch control block 110.

Figure 9:
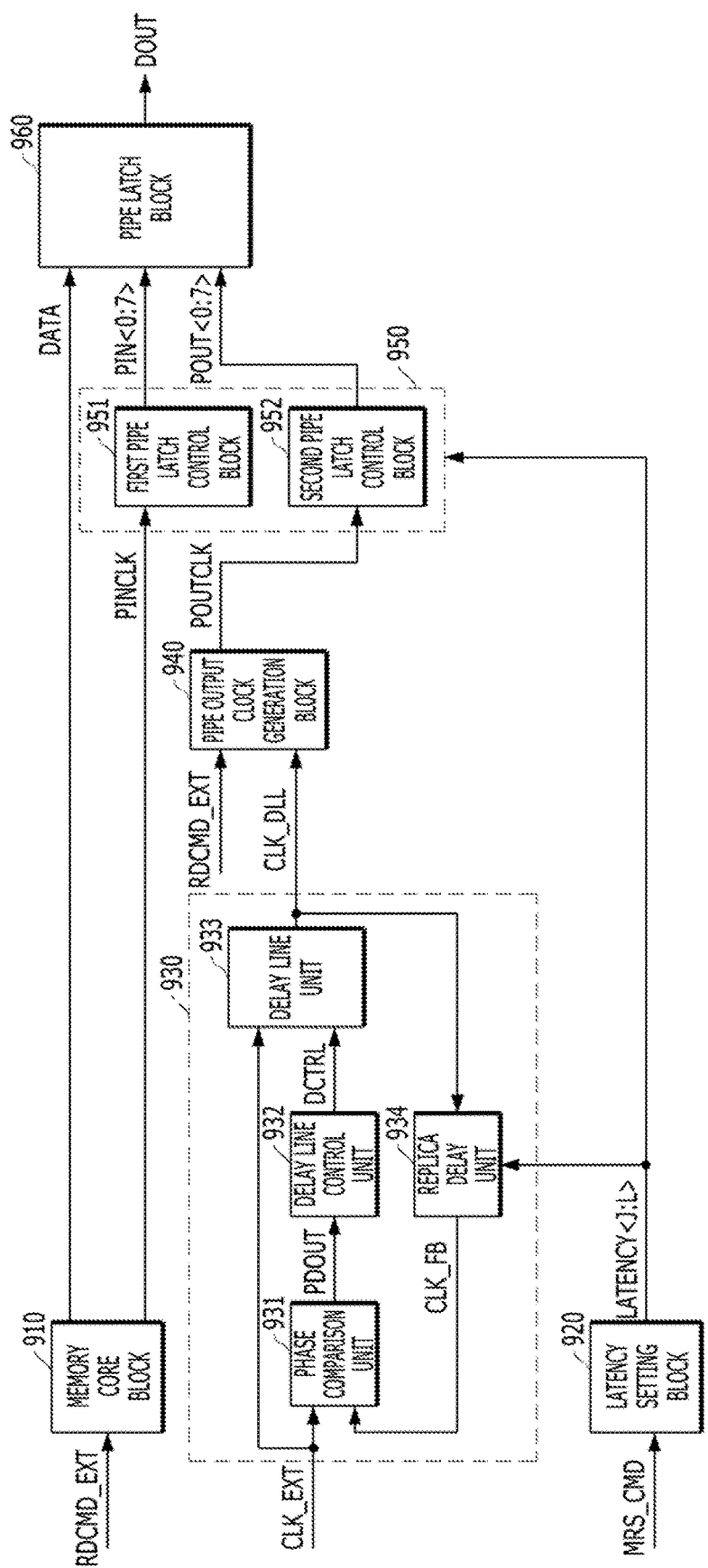
FIG. 9 is a diagram illustrating a data output circuit in accordance with an embodiment of the present invention.

FIG. 9 is a diagram illustrating a data output circuit in accordance with an embodiment of the present invention.

Referring to FIG. 9, the data output circuit may include a memory core block 910, a latency setting block 920, a delay-locked loop 930, a pipe output clock generation block 940, a pipe latch control block 950, and a pipe latch block 960.

The memory core block 910 may output data DATA and a pipe input clock signal PINCLK needed in a read operation, in response to a read command RDCMD_EXT received from an exterior in the read operation. The pipe input clock signal PINCLK, as a signal generated as the read command RDCMD_EXT is delayed by a delay time for which the data DATA is outputted, may be a strobe signal for latching the data DATA received from the memory core block 910, by the pipe latch block 960.

The latency setting block 920 may output latency setting signals LATENCY<J:L> in response to a column address strobe (CAS) latency setting value MRS_CMD received from a mode register set (MRS) (not shown). The latency setting signals LATENCY<J:L> may include information on a CAS latency. A first latency setting signal LATENCY<J> may be outputted in the case where the CAS latency is relatively long, a second latency setting signal LATENCY<L> may be outputted in the case where the CAS latency is relatively short, and a third latency setting signal LATENCY<K> may be outputted in the case where the CAS latency has a latency value between a latency value corresponding to the first latency setting signal LATENCY<J> and a latency value corresponding to the second latency setting signal LATENCY<L>.

The delay-locked loop 930 may include a phase comparison unit 931, a delay line control unit 932, a delay line unit 933, and a replica delay unit 934.

The phase comparison unit 931 may compare the phases of a reference clock signal CLK_EXT and a feedback clock signal CLK_FB, and output a comparison result as a phase comparison signal PDOUT. The reference clock signal CLK_EXT may be a clock signal which is received from an exterior. The feedback clock signal CLK_FB may be a clock signal which is received through the replica delay unit 934 to be described below.

The delay line control unit 932 may generate a delay control signal DCTRL in response to the phase comparison signal PDOUT.

The delay line unit 933 may determine a delay time in response to the delay control signal DCTRL, delay the reference clock signal CLK_EXT by the determined delay time, and output a DLL clock signal CLK_DLL.

The replica delay unit 934 may delay the DLL clock signal CLK_DLL in response to the latency setting signals LATENCY<J:L>, and generate the feedback clock signal CLK_FB. In order to synchronize the reference clock signal CLK_EXT and an output node DOUT, an operation of increasing the delay time of a pipe output clock signal POUTCLK may be needed. For the operation of delaying the pipe output clock signal POUTCLK, the replica delay unit 934 may decrease a replica delay by receiving the latency setting signals LATENCY<J:L>. In other words, in the case where a CAS latency is relatively short, that is, in the case where the second and third latency setting signals LATENCY<L> and LATENCY<K> are received, a replica delay may be decreased. As the replica delay is decreased, the delay of the DLL clock signal CLK_DLL may be increased and thus the pipe output clock signal POUTCLK may be delayed.

The pipe output clock generation block 940 may generate the pipe output clock signal POUTCLK in response to the read command RDCMD_EXT and the DLL clock signal CLK_DLL. As described above, the pipe output clock generation block 940 may output the pipe output clock signal POUTCLK by determining the delay amount of the pipe output clock signal POUTCLK depending on the latency setting signals LATENCY<J:L>.

The pipe latch control block 950 may include a first pipe latch control block 951 and a second pipe latch control block 952. Since the first pipe latch control block 951 and second pipe latch control block 952 have the same configuration and perform the same operation, the first pipe latch control block 951 will be described below representatively.

The first pipe latch control block 951 may generate a plurality of pipe input signals PIN<0:7> depending on the latency setting signals LATENCY<J:L> in response to the pipe input clock signal PINCLK. The pipe latch control block 950 may have the same configuration and perform the same operation as the pipe latch control block 110 shown in FIG. 1. The pipe latch control block 950 may control the plurality of pipe input signals PIN<0:7> to be activated sequentially or to be divided into at least two groups and be activated sequentially by group, in response to the plurality of latency setting signals LATENCY<J:L> which are received according to first to third modes, respectively, and the pipe input clock signal PINCLK. Also, the pipe latch control block 950 may control a plurality of pipe output signals POUT<0:7> to be activated sequentially or to be divided into at least two groups and be activated sequentially by group, in response to the plurality of latency setting signals LATENCY<J:L> and the pipe output clock signal POUTCLK.

The second pipe latch control block 952 may differ from the first pipe latch control block 951 in that it receives the pipe output clock signal POUTCLK instead of the pipe input clock signal PINCLK and generates the plurality of pipe output signals POUT<0:7>. Excluding the difference above, the second pipe latch control block 952 may have the same configuration and perform the same operation as the first pipe latch control block 951.

The pipe latch block 960 may have the same configuration and perform the same operation as the pipe latch block 120 shown in FIG. 1. The pipe latch block 960 may store data DATA of an input node (DIN) in response to the plurality of pipe input signals PIN<0:7> received sequentially from the pipe latch control block 950. The pipe latch block 960 may output stored data to the output node DOUT in response to the plurality of pipe output signals POUT<0:7> received sequentially from the pipe latch control block 950.

Since detailed descriptions for the configuration and operation for the pipe latch control block 950 and the pipe latch block 960 were made above with reference to FIGS. 1 to 8, further descriptions thereof will be omitted herein.

The pipe latch circuit and the data output circuit according to various embodiments of the present invention may use pipe registers individually or through grouping depending on a CAS latency setting value. For example, in the case where a latency setting value is relatively long, it is possible to control all allocated pipe registers to be used individually in such a way as to store and output data sequentially, and, in the case where a latency setting value is relatively short, it is possible to control allocated pipe registers to be grouped in such a way as to store and output data sequentially by group.

As a consequence, in the case where a latency setting value is relatively short, it is possible to reduce a delay due to a loading of the output node DOUT.

Although various embodiments have been described for illustrative purposes, it will be apparent to those skilled in the art that various other changes and modifications may be made without departing from the spirit and scope of the invention as defined in the following claims.

What is claimed is:

1. A pipe latch circuit comprising:
   a pipe latch control block configured to control a plurality of pipe input signals and a plurality of pipe output signals to be activated sequentially or be divided into at least two groups and be activated sequentially by group, depending on a latency setting value, and output at least one pipe input signal and at least one pipe output signal; and
   a pipe latch block coupled between an input node and an output node, and configured to store data of the input node in response to the pipe input signal and output stored data to the output node in response to the pipe output signal,
   wherein pipe input signals included in the same group of the at least two group among the plurality of pipe input signals and pipe output signals included in the same group of the at least two group among the plurality of pipe output signals are activated simultaneously.

2. The pipe latch circuit according to claim 1, wherein the pipe latch control block comprises:
   a first pipe latch control block configured to control the pipe input signals to be activated sequentially or be divided into at least two groups and be sequentially activated by each group, in response to a pipe input clock signal; and
   a second pipe latch control block configured to control the pipe output signals to be activated sequentially or be divided into the at least two groups and be sequentially activated by the each group, in response to a pipe output clock signal.

3. The pipe latch circuit according to claim 2, wherein the first pipe latch control block comprises:
   a plurality of shift registers configured to output sequentially a plurality of shifting signals, respectively, in response to the pipe input clock signal;
   a switching unit configured to control all of the plurality of shift registers to operate, in response to a first latency setting signal of the latency setting value, and control only one or more among the plurality of shift registers to operate, in response to a second latency setting signal of the latency setting value;
   a plurality of AND gates configured to perform AND operations on the pipe input clock signal and the plurality of shifting signals, and output shifting data signals; and
   a pipe input control unit configured to output the shifting data signals as the plurality of pipe input signals in response to the first or second latency setting signal.

4. The pipe latch circuit according to claim 3, wherein the first latency setting signal is activated in the case where the latency setting value corresponding to a column address strobe (CAS) latency is relatively long, and the second latency setting signal is activated in the case where the latency setting value is relatively short.

5. The pipe latch circuit according to claim 2, wherein the second pipe latch control block comprises:
   a plurality of shift registers configured to output sequentially a plurality of shifting signals, respectively, in response to the pipe output clock signal;
   a switching unit configured to control all of the plurality of shift registers to operate, in response to a first latency setting signal of the latency setting value, and control only one or more among the plurality of shift registers to operate, in response to a second latency setting signal of the latency setting value;
   a plurality of AND gates configured to perform AND operations on the pipe output clock signal and the plurality of shifting signals, and output shifting data signals; and
   a pipe output control unit configured to output the shifting data signals as the plurality of pipe output signals in response to the first or second latency setting signal.

6. The pipe latch circuit according to claim 3, wherein the pipe latch block sequentially receives the plurality of pipe input signals and the plurality of pipe output signals, in response to the first latency setting signal, and stores and outputs data individually.

7. The pipe latch circuit according to claim 6, wherein the pipe latch block sequentially receives the plurality of pipe input signals and the plurality of pipe output signals by the each group, in response to the second latency setting signal, and stores and outputs data by the each group.

8. A data output circuit comprising:
   a delay-locked loop configured to delay an external clock signal by a delay value depending on a latency information, and output an output clock signal;
   a pipe latch block coupled between an input node and an output node, and configured to store data of the input node in response to at least one corresponding pipe input signal among a plurality of pipe input signals and output stored data to the output node in response to at least one corresponding pipe output signal among a plurality of pipe output signals;
   a first pipe latch control block configured to control the plurality of pipe input signals to be activated sequentially or be divided into at least two groups depending on the latency information and be sequentially activated by each group, in response to a pipe input clock signal; and
   a second pipe latch control block configured to control the plurality of pipe output signals to be activated sequentially or be divided into the at least two groups depending on the latency information and be sequentially activated by the each group, in response to a pipe output clock signal generated in response to the output clock signal,
   wherein pipe input signals included in the same group of the at least two group among the plurality of pipe input signals and pipe output signals included in the same group of the at least two group among the plurality of pipe output signals are activated simultaneously.

9. The data output circuit according to claim 8, wherein the number of the at least two groups and the delay value are larger in the case where the latency information corresponds to a long latency than the case where the latency information corresponds to a short latency.

10. The data output circuit according to claim 9, wherein the long latency is activated in the case where a column address strobe (CAS) latency is relatively long, and the short latency is activated in the case where the CAS latency is relatively short.

11. The data output circuit according to claim 9, wherein the first pipe latch control block comprises:
- a plurality of shift registers configured to output sequentially a plurality of shifting signals, respectively, in response to the pipe input clock signal;
- a switching unit configured to control all of the plurality of shift registers to operate, in response to a first latency setting signal in the case where the latency information corresponds to the long latency, and control only one or more among the plurality of shift registers to operate, in response to a second latency setting signal in the case where the latency information corresponds to the short latency;
- a plurality of AND gates configured to perform AND operations on the pipe input clock signal and the plurality of shifting signals, and output shifting data signals; and
- a pipe input control unit configured to output the shifting data signals as the plurality of pipe input signals in response to the first or second latency setting signal.

12. The data output circuit according to claim 9, wherein the second pipe latch control block comprises:
- a plurality of shift registers configured to output sequentially a plurality of shifting signals, respectively, in response to the pipe output clock signal;
- a switching unit configured to control all of the plurality of shift registers to operate, in response to a first latency setting signal in the case where the latency information corresponds to the long latency, and control only one or more among the plurality of shift registers to operate, in response to a second latency setting signal in the case where the latency information corresponds to the short latency;
- a plurality of AND gates configured to perform AND operations on the pipe output clock signal and the plurality of shifting signals, and output shifting data signals; and
- a pipe output control unit configured to output the shifting data signals as the plurality of pipe output signals in response to the first or second latency setting signal.

13. The data output circuit according to claim 8, wherein the delay-locked loop comprises:
- a phase comparison unit configured to compare the external clock signal and a feedback clock signal, and output a comparison result value as a phase comparison signal;
- a delay line control unit configured to generate a delay control signal in response to the phase comparison signal;
- a delay line unit configured to determine a delay time in response to the delay control signal, delay the external clock signal by the delay value, and generate a delay-locked loop (DLL) clock signal; and
- a replica delay unit configured to control an internal delay value in response to the latency information, delay the DLL clock signal according to the internal delay value, and generate the feedback clock signal.

14. The data output circuit according to claim 13, further comprising:
- a pipe output clock generation block configured to generate the pipe output clock signal in response to the DLL clock signal.

* * * * *